United States Patent
Asao et al.

(10) Patent No.: US 8,570,102 B2
(45) Date of Patent: Oct. 29, 2013

(54) SWITCHING AMPLIFIER

(75) Inventors: Kei Asao, Osaka (JP); Yoshinori Nakanishi, Osaka (JP)

(73) Assignee: Onkyo Corporation, Neyagawa-shi (JP)

( * ) Notice: Subject to any disclaimer, the term of this patent is extended or adjusted under 35 U.S.C. 154(b) by 57 days.

(21) Appl. No.: 13/353,606

(22) Filed: Jan. 19, 2012

(65) Prior Publication Data

US 2012/0293256 A1    Nov. 22, 2012

(30) Foreign Application Priority Data

May 16, 2011   (JP) .................................. 2011-108935

(51) Int. Cl.
*H03F 3/38*    (2006.01)

(52) U.S. Cl.
USPC .............................. 330/10; 375/238; 381/94.5

(58) Field of Classification Search
USPC ....... 330/10, 51, 298, 207 A, 207 P; 375/238; 381/94.5
See application file for complete search history.

(56) References Cited

U.S. PATENT DOCUMENTS 7,336,060 B2 * 2/2008 Ito .................................. 323/299

FOREIGN PATENT DOCUMENTS

| JP | 2006-352269 | 12/2006 |
| JP | 2007-028455 | 2/2007 |
| JP | 2011-061399 | 3/2011 |

* cited by examiner

*Primary Examiner* — Robert Pascal
*Assistant Examiner* — Khiem Nguyen
(74) *Attorney, Agent, or Firm* — Renner, Otto, Boisselle & Sklar, LLP

(57) ABSTRACT

When a switching amplifier transitions into a power-off state, a switch is turned off and a power supply controller forcibly discharges a capacitor and forcibly reduces a reference potential with respect to a second power supply voltage. Since a logic power supply voltage reduces by the same amount as the reference potential, the logic power supply voltage from a viewpoint of the reference potential is fixed. A constant current circuit reduces a constant current according to the reduction in the reference potential with respect to the second power supply voltage, and reduces a first electric current and a second electric current. Before the logic power supply voltage from the viewpoint of the reference potential reduces, the first electric current and the second electric current are reduced, and an operation of a pulse generating unit can be ended in a normal state.

5 Claims, 5 Drawing Sheets

SWITCHING AMPLIFIER

BACKGROUND OF THE INVENTION

1. Field of the Invention

The present invention relates to a switching amplifier having a pulse-width modulating circuit.

2. Description of the Related Art

FIG. 5 is a circuit diagram illustrating a pulse-width modulating circuit proposed by the applicants of this invention. This circuit is not publicly known at the time of the application. The pulse-width modulating circuit charges/discharges capacitors C1 and C2 by means of collector electric currents I1 and I2 of transistors Q1 and Q2, so as to output pulses having two levels composed of a high level and a low level from inverters INV1 and INV2. The pulse-width modulating circuit inputs an audio signal in as an input signal, controls a distribution ratio between collector currents of the transistors Q1 and Q2 from a constant current, and controls charging time of the capacitors C1 and C2 so as to modulate pulse widths of output pulses. As a result, the pulse-width modulating circuit outputs PWM (pulse-width modulation) signals from the inverters INV1 and INV2.

The pulse-width modulating circuit alternately repeats a state that one of inputs of the inverters INV1 and INV2 is at a high level and the other input is at a low level, so as to be capable of outputting PWM signals. However, when both the capacitors C1 and C2 are charged and both the inputs of the inverters INV1 and INV2 are at the high level, the pulse-width modulating circuit cannot output the PWM signals. The details are described below.

FIG. 3 is a timing chart illustrating voltage waveforms at respective points of the pulse-width modulating circuit. Power supply voltages of the inverters INV1 and INV2 are logic power supply voltages Vdd (for example, 5 V) with respect to a reference potential V3. Threshold voltages Vth of the inverters INV1 and INV2 are about Vdd/2. At time t1 to t2, the electric current I1 flows into the capacitor C1 so as to charge the capacitor C1. When the capacitor C1 is charged, a voltage at point A gradually rises. At time t2, when the input (voltage at point A) of the inverter INV1 is the threshold voltage Vth or more of the inverter INV1, an output (voltage at point B) of the inverter INV1 is inverted from the high level to the low level. When the output from the inverter INV1 is at the low level, the capacitor C2 is discharged (the capacitor C2 is discharged when the voltage at point B becomes 5 V (t1 to t2) and electric charges of 5.6 V or more pass through a logic power supply via the diode D2), an input (voltage at point C) of the inverter INV2 connected to the output of the inverter INV1 via the capacitor C2 is at a low level, and an output of the inverter INV2 (voltage at point D) is inverted from a low level into a high level. When the output of the inverter INV2 is inverted into the high level, the input of the inverter INV1 (voltage at point A) is at the high level. Thereafter, the capacitor C2 is charged with the electric currents I2 so that a reverse operation to the above operation is performed (time t2 to t3).

A time required for the input of the inverter INV1 at the low level to reach the threshold voltage Vth due to the charging of the capacitor C1 is controlled by a magnitude of the electric currents I1. A time required for the input of the inverter INV2 at the low level to reach the threshold voltage Vth due to the charging of the capacitor C2 is controlled by a magnitude of the electric currents I2. The repetition of this operation causes the inverters INV1 and INV2 to alternately output a high-level or low-level pulse.

Although the input (voltage at point A) of the inverter INV1 is inverted from the low level into the high level at time t2, a voltage value at this time becomes a value obtained by adding a logic power supply voltage Vdd to the threshold voltage Vth (for example, 5+2.5=7.5 V). This voltage has the value viewed from the reference potential V3. Since the input (point A) of the inverter INV1 is discharged to a logic power supply voltage Vdd via a diode D1 during time t2 to t3, the voltage is stabilized at a value (for example, 5.6 V) obtained by adding a voltage between both ends (for example, 0.6 V) of the diode D1 to the logic power supply voltage Vdd. Although the voltage of the input (point A) of the inverter INV1 is inverted from the high level into the low level at time t3, it is not completely reduced to the reference potential V3 and is reduced to a value obtained such that the reference potential V3+ the voltage between both ends (for example, 0.6 V) of the diode D1.

When a switching amplifier to which the pulse-width modulating circuit is applied transitions from a power-on state into a power-off state, both the inputs of the inverters INV1 and INV2 are brought into the high level, and thus PWM signals cannot be output. That is to say, in a transient state of the transition into the power-off state, as a first power supply voltage V1 reduces, the logic power supply voltage Vdd generated from the first power supply voltage V1 reduces. When the logic power supply voltage Vdd with respect to the reference potential V3 reduces to a value less than a voltage (for example, 1.2 V) twice as high as the voltage between both ends of the diodes D1 and D2, the threshold voltages Vth of the inverters INV1 and INV2 are less than the voltage between both ends (for example, 0.6 V) of the diodes D1 and D2. Therefore, when the electric currents I1 and I2 are supplied to the capacitor C1 and C2, respectively and the charging and discharging of the capacitors C1 and C2 are repeated in this state, in FIGS. 3A and 3C, when the inputs of the inverters INV1 and INV2 are inverted from the high level into the low level, lowest voltages of the input of the inverters INV1 and INV2 cannot be the threshold voltages or less of the inverters INV1 and INV2. This is because although the voltages of the inputs of the inverters INV1 and INV2 reduce to only the reference potential V3+ the voltage between the both ends of the diodes D1 and D2 (for example, 0.6 V), the threshold voltages Vth of the inverters INV1 and INV2 reduce to not more than the value obtained by the reference potential V3+ the voltage between the both ends of the diodes D1 and D2. As a result, a state where both the inputs of the inverters INV1 and INV2 are at the high level is generated, and thus the pulse-width modulating circuit cannot output PWM signals.

When the switching amplifier is powered on after powered off and then sufficient time passes, charging voltages of the capacitors C1 and C2 are discharged or the operations of the inverters INV1 and INV2 stop. In this state, since both of them do not output low-level voltages, the pulse-width modulating circuit can normally start its operation. However, in a state that the first power supply voltage V1 and the reference potential V3 are not yet 0 V, the inverters INV1 and INV2 still continue the operations, both the inputs are at the high level, and both the outputs are low level, when the power is again turned on, the pulse-width modulating circuit cannot start the operation and stops.

SUMMARY OF THE INVENTION

It is an object of the present invention to provide a switching amplifier that solves a problem such that at a time of transition into a power-off state, both inputs of two output elements are brought into a high level, and at next time of transition into a power-on state, an operation cannot be started.

A switching amplifier operated by a first power supply voltage, a second power supply voltage, and a reference potential as an electric potential between the first power supply voltage and the second power supply voltage, the switching amplifier comprises: a pulse-width modulating circuit for outputting a pulse width modulation signal according to an input signal; a logic power supply circuit for generating a logic power supply voltage with respect to the reference potential based on the first power supply voltage with respect to the reference potential, and supplying the generated logic power supply voltage to the pulse-width modulating circuit; and a switching output circuit that is operated on/off according to the pulse width modulation signal. The pulse-width modulating circuit includes; a pulse generating unit being operated by the reference potential and the logic power supply voltage, the pulse generating unit having a first accumulating unit, a second accumulating unit, a first output element and a second output element, the pulse generating unit outputting the pulse width modulation signal from at least one of the first output element and the second output element by charging the first accumulating unit with a first electric current and charging the second accumulating unit with a second electric current, a constant current circuit for generating a constant current, and when a switching amplifier transitions into an off state, reducing the constant current according to a reduction in the reference potential with respect to the second power supply voltage, a current distribution unit for controlling a distribution ratio between the first electric current and the second electric current based on the input signal and the constant current, and controlling a time required for charging the first accumulating unit with the first electric current and a time required for charging the second accumulating unit with the second electric current so as to control a pulse width of the pulse width modulation signal. The switching amplifier further comprises: a power supply controller for, when the switching amplifier transitions into a power-off state, forcibly reducing the reference potential with respect to the second power supply voltage.

When the switching amplifier transitions into the power-off state, a power supply controller forcibly reduces a reference potential with respect to a second power supply voltage. "To forcibly reduce" means "to immediately reduce the reference potential with respect to the second power supply voltage without waiting for a natural reduction in the reference potential with respect to the second power supply voltage by powering off the switching amplifier". On the other hand, conventionally the first power supply voltage with respect to the reference potential naturally reduces due to powering-off of the switching amplifier without forcible reduction. Therefore, a logic power supply voltage with respect to the reference potential generated by the first power supply voltage with respect to the reference potential reduces by the same amount as the reference potential, a logic power supply voltage viewed from the reference potential is maintained at a fixed voltage value. When the reference potential with respect to the second power supply voltage is forcibly reduced, a constant current circuit reduces a constant current according to the reduction in the reference potential with respect to the second power supply voltage. As a result, a first electric current and a second electric current supplied to a first accumulating unit and a second accumulating unit are reduced. Therefore, before the logic power supply voltage viewed from the reference potential reduces (namely, threshold voltages of a first output element and a second output element become less than a lowest voltage at the time of discharging the first accumulating unit and the second accumulating unit), the first electric current and the second electric current are reduced, so that an operation of a pulse generating unit can be ended in a normal state. That is to say, both inputs of the first output element and the second output element are prevented from being at the high level, and a pulse-width modulating circuit can be prevented from being inoperable.

Preferably the switching amplifier further comprising: a first capacitor for determining the first power supply voltage with respect to the reference potential; and a second capacitor for determining the reference potential with respect to the second power supply voltage. When the switching amplifier transitions into the power-off state, the power supply controller forcibly discharges a charging voltage of the second capacitor.

When the switching amplifier transitions into the power-off state, the power supply controller forcibly discharges a charging voltage of a second capacitor, and thus the reference potential with respect to the second power supply voltage can be forcibly reduced.

Preferably the power supply controller includes a first transistor connected between an end connected to the reference potential of the second capacitor and a line of the second power supply voltage, and when the switching amplifier transitions into the power-off state, the first transistor is turned on so that the end connected to the reference potential of the second capacitor is connected to the line of the second power supply voltage via the first transistor.

When the switching amplifier transitions into the power-off state, a first transistor is turned on, and an end connected to the reference potential of the second capacitor is connected to a line of the second power supply voltage via the first transistor. For this reason, the voltage of the second capacitor is discharged into a line of the second power supply voltage via the first transistor. Therefore, the reference potential of the second power supply voltage can be forcibly reduced.

Preferably the constant current circuit includes a second transistor, a third capacitor and a zener diode, a first terminal of the second transistor is connected to the line of the second power supply voltage, a second terminal of the second transistor is connected to the current distribution unit, a control terminal of the second transistor is connected to the line of the second power supply voltage via the third capacitor and connected to a cathode of the zener diode and the reference potential, and an anode of the zener diode is connected to the line of the second power supply voltage, an electric current flowing in the second terminal of the second transistor is the constant current and when the reference potential is less than a predetermined voltage determined by the zener voltage of the zener diode, a voltage of the control terminal of the second transistor reduces according to a reduction in the reference potential with respect to the second power supply voltage, and the constant current is reduced.

When a zener diode is on, the constant current circuit generates a constant current by supplying a cathode voltage of the zener diode to a control terminal of a second transistor. When the reference potential with respect to the second power supply voltage is forcibly reduced to be less than a predetermined voltage determined by a zener voltage of the zener diode, a voltage of a third capacitor is discharged into a line of the reference potential so that a voltage supplied to the control terminal of the second transistor reduces according to a reduction in the reference potential of the second power supply voltage. Therefore, as the reference potential with respect to the second power supply voltage reduces, the constant current can be reduced.

Preferably the first accumulating unit and the second accumulating unit are capacitors, the first output element and the second output element are inverters, one end of the first accumulating unit is connected to an input of the first output element, an output of the first output element is connected to one end of the second accumulating unit, the other end of the second accumulating unit is connected to an input of the second output element, and an output of the second output element is connected to the other end of the first accumulating unit, when the reference potential with respect to the second power supply voltage is forcibly reduced in the case where the switching amplifier transitions into the power-off state, before the logic power supply voltage reduces and the threshold voltages of the first output element and the second output element are less than lowest voltages at the time of discharging the first accumulating unit and the second accumulating unit, the constant current circuit reduces the constant current.

Before the logic power supply voltage viewed from the reference potential decreases (namely, the threshold voltages of the first output element and the second output element become less than a lowest voltage at the time of discharging the first accumulating unit and the second accumulating unit), the first electric current and the second electric current are decreased, so that the operation of the pulse generating unit can be ended in the normal state. That is to say, both the inputs of the first output element and the second output element are prevented from being at the high level, thereby preventing the pulse-width modulating circuit from being inoperable.

DETAILED DESCRIPTION OF THE PREFERRED EMBODIMENTS

Figure 1:
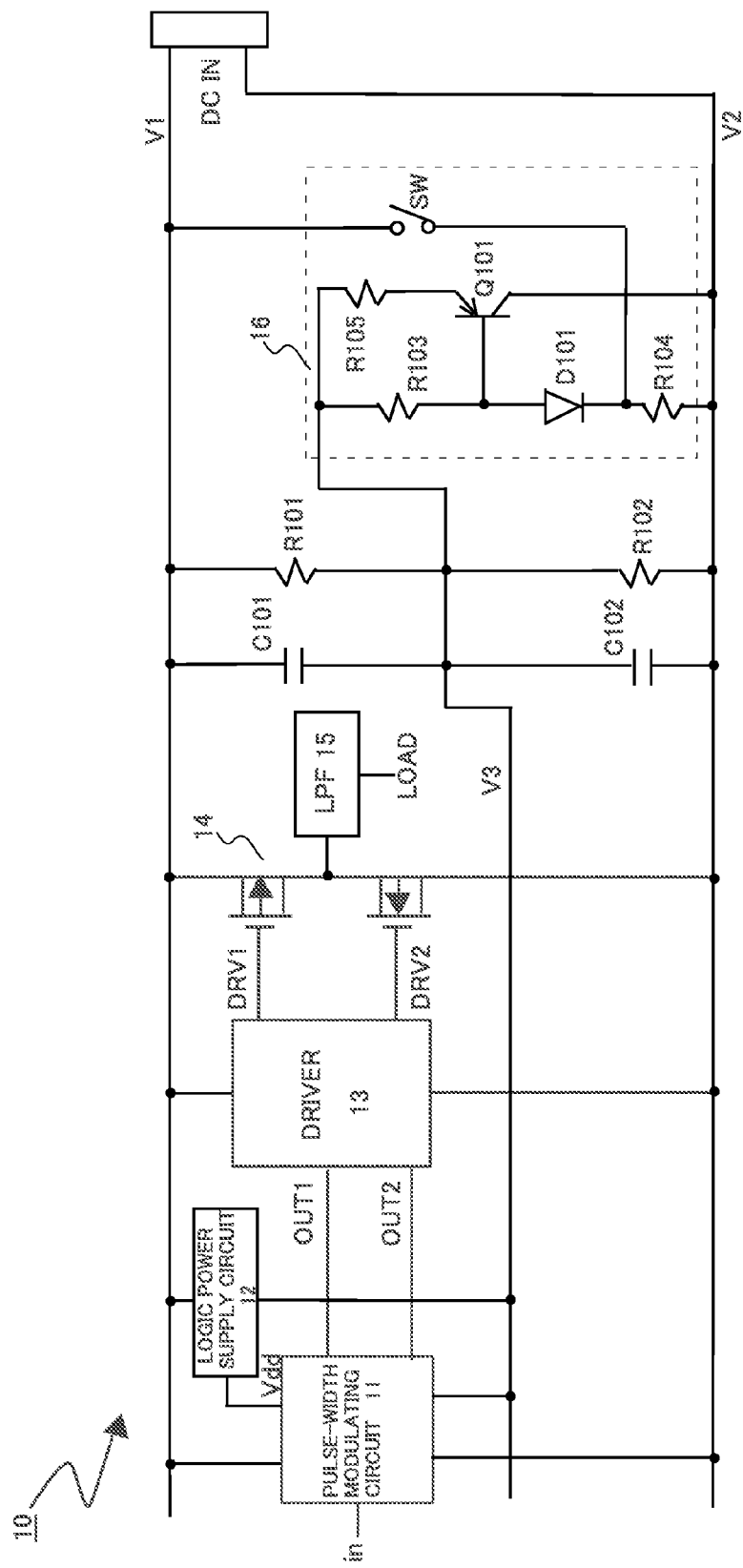
FIG. 1 is a schematic block diagram illustrating a switching amplifier 10 according to a preferred embodiment of the present invention.

A preferred embodiment of the present invention will be concretely described below with reference to the drawings, but the present invention is not limited to the embodiment. FIG. 1 is a schematic circuit block diagram illustrating the switching amplifier 10 according to the preferred embodiment of the present invention. The switching amplifier 10 generally has a pulse-width modulating circuit 11, a logic power supply circuit 12, a driver 13, a switching output circuit 14, an LPF (Low Pass Filter) 15, and a power supply controller 16.

The switching amplifier 10 is operated by a single power supply, for example. That is to say, the switching amplifier 10 is operated by a first power supply voltage V1 (for example, +24 V), a second power supply voltage V2 (for example, 0 V (ground potential)) and a reference potential V3. The reference potential V3 is an electric potential between the first power supply voltage V1 and the second power supply voltage V2, and it is generated by dividing the first power supply voltage V1 with respect to the second power supply voltage V2 using resistors R101 and R102. The reference potential V3 is +12 V, for example. Not limited to this, when positive and negative power supplies are employed, the first power supply voltage V1 may be +12 V, the second power supply voltage V2 may be −12 V, and the reference potential V3 may be 0V (ground potential).

More specifically, a capacitor C101 is a capacitor for determining the first power supply voltage V1 with respect to the reference potential V3, its one end is connected to a first power supply voltage V1 line, and the other end is connected to a reference potential V3 line. A capacitor C102 is a capacitor for determining the reference potential V3 with respect to the second power supply voltage V2, its one end is connected to a reference potential V3 line, and the other end is connected to the second power supply voltage V2 line. The first power supply voltage V1 is supplied from a power circuit, not shown, to the first power supply voltage V1 line, and the second power supply voltage V2 is supplied from a power circuit, not shown, to the second power supply voltage V2 line. A voltage obtained by subtracting the second power supply voltage V2 from the first power supply voltage V1 is divided by resistors R101 and R102, and is supplied as the reference potential V3 to the reference potential V3 line.

The pulse-width modulating circuit 11 modulates a pulse width of an audio signal in as an input signal so as to generate a first PWM signal OUT1 and a second PWM signal OUT2. Normally, when one of the first PWM signal OUT1 and the second PWM signal OUT2 is a high level signal, the other one is a low-level signal. The pulse-width modulating circuit 11 is operated by the first power supply voltage V1, the reference potential V3 and the second power supply voltage V2. Inverters INV1 and INV2 (described later) of the pulse-width modulating circuit 11 are operated by a logic power supply voltage Vdd from the logic power supply circuit 12 and the reference potential V3. The pulse-width modulating circuit 11 may output at least one of the PWM signal OUT1 and the PWM signal OUT2.

The logic power supply circuit 12 is operated by the first power supply voltage V1 and the reference potential V3, and generates the logic power supply voltage Vdd with respect to the reference potential V3 that is an operating voltage of the inverters INV1 and INV2 of the pulse-width modulating circuit 11 based on the first power supply voltage V1 with respect to the reference potential V3 so as to supply the generated voltage to the pulse-width modulating circuit 11. Details of the pulse-width modulating circuit 11 and the logic power supply circuit 12 are described later with reference to FIG. 2.

The driver 13 inputs the first PWM signal OUT1 and the second PWM signal OUT2, and outputs driving signals DRV1 and DRV2 for driving respective switching elements of the switching output circuit 14. The driver 13 is operated by the first power supply voltage V1 and the second power supply voltage V2.

The switching output circuit 14 is connected between the first power supply voltage V1 and the second power supply voltage V2, and outputs the first power supply voltage V1 or the second power supply voltage V2 to the LPF 15 in response to the driving signals DRV1 and DRV2. The switching output circuit 14 has two switching elements (particularly not limit to but for example, nch MOSFET and pch MOSFET) connected between the first power supply voltage V1 and the second power supply voltage V2.

The LPF 15 is connected between an output terminal of the switching output circuit 14 and an output terminal of the switching amplifier 10, and eliminates a high-frequency component from a voltage output from the switching output circuit 14, and outputs an audio signal to a load such as an externally connected speaker. The LPF 15 includes a coil and a capacitor, not shown.

Figure 2:
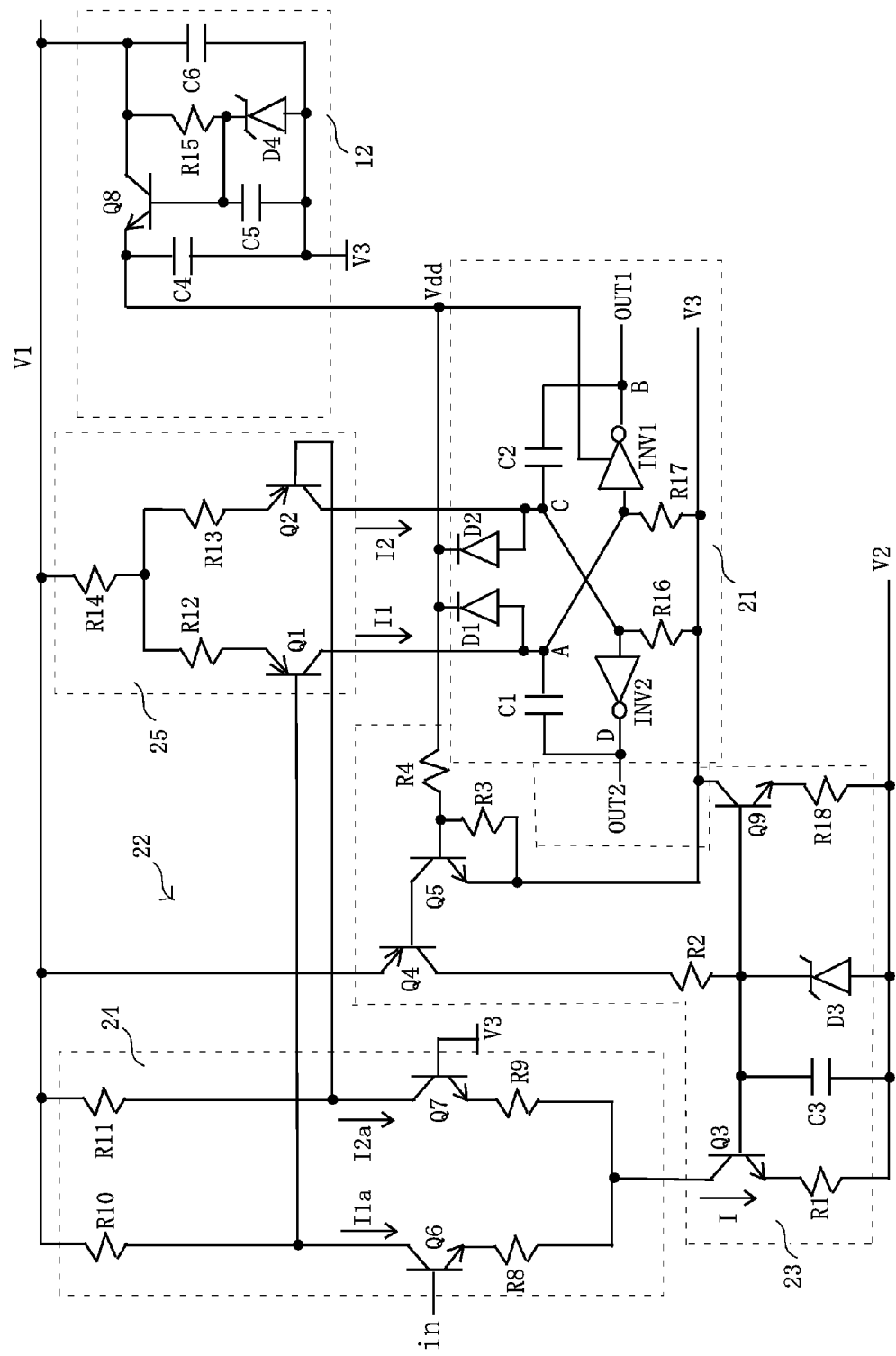
FIG. 2 is a circuit diagram illustrating a pulse-width modulating circuit 11 and a logic power supply circuit 12 according to the preferred embodiment of the present invention.
Figure 3:
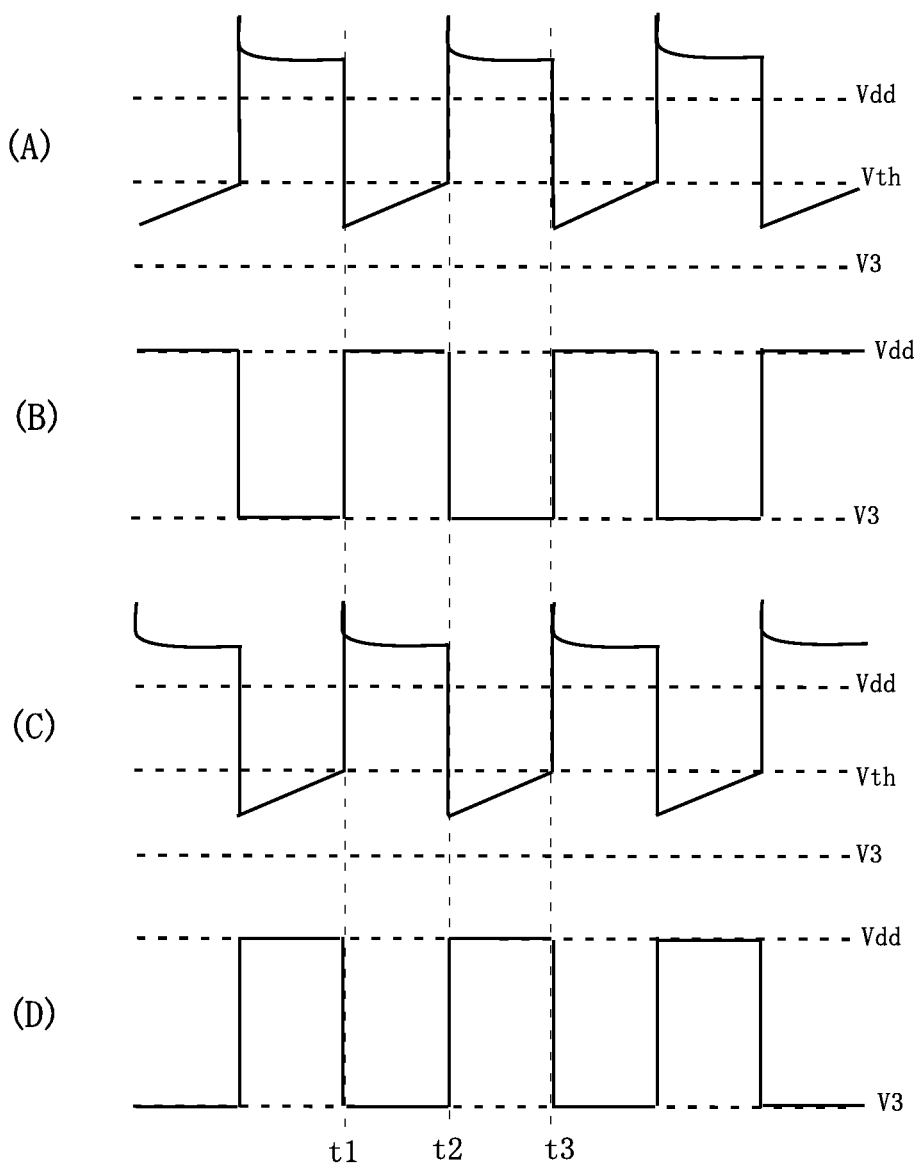
FIGS. 3A, 3B, 3C and 3D are voltage waveform charts illustrating an operation of the pulse-width modulating circuit 11.

FIG. 2 is a circuit diagram illustrating the pulse-width modulating circuit 11 and the logic power supply circuit 12. The pulse-width modulating circuit 11 includes a pulse generating unit 21 and a modulating unit 22. The pulse generating unit 21 and the modulating unit 22 compose a PWM circuit using an astable multivibrator.

The pulse generating unit 21 charges/discharges a capacitor (a first accumulating unit) C1 and a capacitor (a second accumulating unit) C2 with the electric current I1 and the electric current I2, and outputs a pulse with a high level or a pulse with a low level from a first output element or a second output element. The first output element and the second output element are the inverters INV1 and INV2 in this example. When input voltages are the threshold voltage or more, the inverters INV1 and INV2 output low-level signals, and when the input voltages are less than the threshold value, they output high-level signals. The inverters INV1 and INV2 output pulses by repeating an operation such that when one of the inverters INV1 and INV2 outputs a high-level signal, the other inverter outputs a low-level signal.

The pulse generating unit 21 includes the inverters INV1 and INV2, capacitors C1 and C2, and diodes D1 and D2, and outputs pulses whose widths are compatible with charging time of the capacitors C1 and C2. The inverters INV1 and INV2 are operated by the logic power supply voltage Vdd from the logic power supply circuit 12 and the reference potential V3. Threshold voltages of the inverters INV1 and INV2 are Vdd/2. An output of the inverter INV1 is connected to one end of the capacitor C2, and its input is connected to one end of the capacitor C1 and a collector of a transistor Q1. An output of the inverter INV2 is connected to the other end of the capacitor C1, and its input is connected to the other end of the capacitor C2 and a collector of a transistor Q2. The diode D1 is connected to a line of the logic power supply voltage Vdd and one end of the capacitor C1, and the diode D2 is connected to a line of the logic power supply voltage Vdd and the other end of the capacitor C2.

The modulating unit 22 controls a distribution ratio between the electric current I1 and the electric current I2 based on an input signal (for example, audio signal) in, so as to change the pulse widths of the output pulses from the inverters INV1 and INV2. The modulating unit 22 includes a constant current circuit 23, a first current distribution circuit 24 and a second current distribution circuit 25. The first current distribution circuit 24 and the second current distribution circuit 25 compose a current distribution unit.

The constant current circuit 23 is connected to the first power supply voltage V1, the second power supply voltage V2 and the reference potential V3, and generates a constant current I based on a base voltage of a transistor Q3, the second power supply voltage V2 and the resistor R1. When the reference potential V3 with respect to the second power supply voltage V2 is less than a predetermined voltage, the base voltage of the transistor Q3 reduces according to a reduction in the reference potential V3 with respect to the second power supply voltage V2, and the constant current circuit 23 reduces the constant current I.

The constant current circuit 23 includes transistors Q3, Q4, Q5 and Q9, resistors R1, R2, R3, R4 and R18, a capacitor C3, and a zener diode D3. An emitter of the transistor Q3 is connected to the second power supply voltage V2 line via the resistor R1, and its collector is connected to the first current distribution circuit 24, and its base is connected to connecting points of the resistor R2 and cathode of the zener diode D3 and the capacitor C3 and base of the transistor Q9. An emitter of the transistor Q4 is connected to the first power supply voltage V1 line, its collector is connected to the resistor R2, and its base is connected to a collector of the transistor Q5. An emitter of the transistor Q5 is connected to the reference potential V3 line, and its base is connected to the reference potential V3 line via the resistor R3 and to a logic power supply voltage Vdd line via the resistor R4. An emitter of the transistor Q9 is connected to the second power supply voltage V2 line via the resistor R18, and its collector is connected to the reference potential V3 line.

Since the logic power supply voltage Vdd is supplied to the base of the transistor Q5 and the transistor Q5 is turned on, so that the transistor Q4 is turned on, the first power supply voltage V1 is supplied to the cathode of the zener diode D3 via the resistor R2 so that the zener diode D3 is turned on. As a result, a zener voltage (for example, 5 V) of the zener diode D3 is supplied to the base of the transistor Q3. The transistor Q3 generates the constant current I as a collector current according to the voltage supplied to the base.

In the constant current circuit 23, in the case where the switching amplifier 10 transitions into the power-off state, when the reference potential V3 with respect to the second power supply voltage V2 is forcibly reduced by the power supply controller 16 so as to reach a voltage obtained by subtracting a base-to-collector potential of the transistor Q9 from the zener voltage of the zener diode D3, the voltage of the capacitor C3 is discharged into the reference potential V3 line via the base-to-collector of the transistor Q9. Similarly, the voltage of the capacitor C3 is discharged into the reference potential V3 line via the resistor R2, the transistors Q4 and Q5. As a result, the voltage supplied to the base of the transistor Q3 reduces according to the reduction in the reference potential V3, so that the constant current I reduces.

The first current distribution circuit 24 includes transistors Q6 and Q7, and the resistors R8 to R11. The input signal in is input into a base of the transistor Q6, its collector is connected to the first power supply voltage V1 line via the resistor R10 and to the base of the transistor Q1, and its emitter is connected to the resistor R8. A base of the transistor Q7 is connected to the reference potential V3 line, its collector is connected to the first power supply voltage V1 line via the resistor R11 and to the base of the transistor Q2, and its emitter is connected to the resistor R9.

An electric current I1a is a collector current of the transistor Q6, an electric current I2a is a collector current of the transistor Q7, a sum of the electric current I1a and the electric current I2a is equal to the constant current I generated by the constant current circuit 23. When the input signal in is supplied to the base of the transistor Q6, a distribution ratio between the electric current I1a and the electric current I2a based on the constant current I is controlled according to the input signal in.

The second current distribution circuit 25 includes the transistors Q1 and Q2, and the resistors R12, R13 and R14. The base of the transistor Q1 is connected to a connecting point between a collector of the transistor Q6 and the resistor R10, its emitter is connected to the resistor R12, and its collector is connected to one end of the capacitor C1 and the input of the inverter INV1. The base of the transistor Q2 is connected to a connecting point between the collector of the transistor Q7 and the resistor R11, its emitter is connected to the resistor R13, and its collector is connected to the other end of the capacitor C2 and the input of the inverter INV2. One end of the resistor R14 is connected to the resistors R12 and R13, and the other end is connected to the first power supply voltage V1 line.

The electric current I1 is a collector current of the transistor Q1, and the electric current I2 is a collector current of the transistor Q2. The electric current I1 changes according to the electric current I1a as the collector current of the transistor Q6 (namely, in proportion to the electric current I1a). The electric current I2 changes according to the electric current I2a as the collector current of the transistor Q7 (namely, in proportion to the electric current I2a). Therefore, it can be said that the distribution ratio between the electric currents I1 and I2 as the electric currents based on the first power supply voltage V1 is substantially determined according to the input signal in. As a result, an amplitude of the input signal in controls a time required for charging the capacitors C1 and C2 with the first electric current I1 and the second electric current I2, and pulse widths of the output pulses from the inverters INV1 and INV2 can be changed.

The logic power supply circuit 12 includes a transistor Q8, the resistor R15, capacitors C4, C5 and C6, and a zener diode D4. A base of the transistor Q8 is connected to the reference potential V3 line via the capacitor C5 and connected to a connecting point between the resistor R15 and the cathode of the zener diode D4, its emitter is connected to the capacitor C4, its collector is connected to the cathode of the zener diode D4 via the resistor R15 and to the first power supply voltage V1 line and the capacitor C6. An anode of the zener diode D4 is connected to the reference potential V3 line. The other end of the capacitor C5 and the other end of the capacitor C6 are connected to the reference potential V3 line.

When the first power supply voltage V1 and the reference potential V3 are supplied to the logic power supply circuit 12 and a voltage that is a zener voltage (for example, 5.6 V) or more is supplied to the cathode of the zener diode D4, the zener diode D4 is turned on, and the zener voltage is supplied to the base of the transistor Q8. As a result, the transistor Q8 is turned on, the capacitor C4 is charged with a voltage obtained by subtracting the voltage of the transistor Q8 from the zener voltage (for example, the reference potential V3+5 V=17 V), and the obtained voltage is supplied as the logic power supply voltage Vdd to the respective sections of the pulse-width modulating circuit 11. The logic power supply voltage Vdd is such that (the voltage of the capacitor C4– a base-to-emitter voltage of the transistor Q8)=((V3+5)–0.6) V.

As shown in FIG. 1, when the switching amplifier 10 transitions from the power-on state into the power-off state, the power supply controller 16 forcibly reduces the reference potential V3 with respect to the second power supply voltage V2. The power-off state may be a standby state such that the power supply voltage is supplied only to the control unit such as a microcomputer. "To forcibly reduce" means that the reference potential V3 with respect to the second power supply voltage V2 is immediately discharged and reduced without wanting for natural discharging and reduction in the reference potential V3 with respect to the second power supply voltage V2 by causing the switching amplifier 10 to transition into the power-off state. More specifically, the power supply controller 16 forcibly discharges a voltage of a capacitor C102 for determining the reference potential V3 with respect to the second power supply voltage V2, thereby to forcibly reduce the reference potential V3 with respect to the second power supply voltage V2.

The power supply controller 16 generally includes a transistor Q101, a diode D101, resistors R103, R104 and R105, a switch unit SW. A base of the transistor Q101 is connected to the reference potential V3 line via the resistor R103 and to an anode of the diode D101, its emitter is connected to the reference potential V3 line via the resistor R105, and its collector is connected to the second power supply voltage V2 line. A cathode of the diode D101 is connected to the second power supply voltage V2 line via the resistor R104 and to the first power supply voltage V1 line via the switch unit SW.

The switch unit SW is a mechanical switch that is controlled into an on state or an off state in association with a switching operation of a power switch between on/off states performed by a user, but the switch unit SW is not limited to this and may be controlled into the on/off states according to a control signal from the control unit such as a microcomputer. When the switching amplifier 10 is powered on, the switch unit SW is turned on, and the first power supply voltage V1 (namely, a high-level voltage) is thus supplied to the cathode of the diode D101. Therefore, the diode D101 is turned off, and the reference potential V3 is thus supplied to the base of the transistor Q101 so that the transistor Q101 is turned off. Accordingly, the capacitor C102 is not forcibly discharged. On the other hand, when the switching amplifier 10 is powered off, the switch unit SW is turned off, and the second power supply voltage V2 (namely, a low-level voltage) is thus supplied to the cathode of the diode D101. Therefore, the diode D101 is turned on, and the second power supply voltage V2 is supplied to the base of the transistor Q101 so that the transistor Q101 is turned on. Therefore, the capacitor C102 is connected to the second power supply voltage V2 line via the resistor R105 and the emitter-to-collector of the transistor Q101, and is, thus, forcibly discharged.

On the other hand, the first power supply voltage V1 with respect to the reference potential V3 is not forcibly reduced, but is naturally reduced by powering off the switching amplifier 10. That is to say, the capacitor C101 is not forcibly discharged. Therefore, since the logic power supply voltage Vdd reduces much as the reference potential V3, the logic power supply voltage Vdd maintains a fixed value from a viewpoint of the reference potential V3. For example, the logic power supply voltage Vdd from the viewpoint of the reference potential V3 is maintained at 5 V.

The reference potential V3 with respect to the second power supply voltage V2 is forcibly reduced, and the first power supply voltage V1 with respect to the reference potential V3 is not forcibly reduced. As a result, before the logic power supply voltage Vdd viewed from the reference potential V3 reduces (namely, before the logic power supply voltage Vdd viewed from the reference potential V3 is less than a voltage that is twice as high as voltages between both ends of the diodes D1 and D2), the constant current I generated by the constant current circuit 23 is sufficiently reduced, so that the electric currents I1 and I2 supplied to the capacitors C1 and C2 can be sufficiently reduced. As a result, both the charging voltages of the capacitors C1 and C2 are prevented from not being less than the threshold voltages Vth of the inverters INV1 and INV2, thereby preventing both the input of the inverter INV1 and the input of the inverter INV2 from being at the high level.

An operation of the switching amplifier 10 having the above constitution is described. First, a basic operation of the pulse-width modulating circuit 11 is described with reference to FIGS. 3A to 3D. Respective voltage waveforms in FIGS. 3A to 3D show voltage waveforms at points A to D of the pulse-width modulating circuit 11 in FIG. 2. At time t1 to t2, the electric current I1 flows into the capacitor C1, and the capacitor C1 is charged. When the capacitor C1 is charged, the voltage at point A gradually rises. At time t2, the input (voltage at point A) of the inverter INV1 becomes the threshold voltages Vth or more of the inverter INV1, and an output of the inverter INV1 (voltage at point B) is inverted from the high level into the low level. When the output of the inverter INV1 is at the low level, the capacitor C2 is instantaneously discharged, and the input (voltage at point C) of the inverter INV2 connected to the output of the inverter INV1 via the capacitor C2 is at the low level, and an output (voltage at point D) of the inverter INV2 is inverted from the low level into the high level. When the output of the inverter INV2 is inverted into the high level, the input (voltage at point A) of the inverter INV1 is at the high level.

At time t2 to t3, the electric current I2 flows into the capacitor C2, and the capacitor C2 is charged. When the capacitor C2 is charged, the voltage at point C gradually rises. At time t3, the input (the point C voltage) of the inverter INV2 becomes the threshold voltages Vth or more of the inverter INV2, and the output (voltage at point D) of the inverter INV2 is inverted from the high level into the low level. When the output of the inverter INV2 is at the low level, the capacitor C1 is instantaneously discharged (actually, the discharging of the capacitor C2 is carried out when the voltage at point B becomes 5 V (t1 to t2), and electric charges of 5.6 V or more passes through the logic power supply via the diode D2). The input (voltage at point A) of the inverter INV1 connected to the output of the inverter INV2 via the capacitor C1 is at the low level, and the output of the inverter INV1 (voltage at point B) is inverted from the low level into the high level. When the output of the inverter INV1 is inverted into the high level, the input (the voltage at point C) of the inverter INV2 is at the high level.

Time for which the input of the inverter INV1 at the low level reaches the threshold voltage Vth due to the charging of the capacitor C1 is controlled by a magnitude of the electric current I1. Time for which the input of the inverter INV2 at the low level reaches the threshold voltage Vth due to the charging of the capacitor C2 is controlled by a magnitude of the electric current I2. This operation is repeated so that the high-level and low-level pulses are output alternately from the inverters INV1 and INV2.

For example, at time t2, the input of the inverter INV1 (voltage at point A) is inverted into the high level, and a voltage value at this time is a value obtained by adding the logic power supply voltage Vdd to the threshold voltages Vth (for example, 2.5+5=7.5 V from the viewpoint of the reference potential V3). During time t2 to t3, since the input (voltage at point A) of the inverter INV1 is discharged into the logic power supply voltage Vdd line via the diode D1, the input of the inverter INV1 is stabilized at a voltage (for example, 5.6 V from the viewpoint of the reference potential V3) obtained by adding the voltage between both ends of the diode D1 (for example, 0.6 V) to the logic power supply voltage Vdd. Therefore, at time t3, the input (voltage at point A) of the inverter INV1 is instantaneously inverted from the high level into the low level, and does not completely reduce to the reference potential V3 but reduces only to the reference potential V3+ the voltage between both ends of the diode D1 (for example, 0.6 V).

Figure 4:
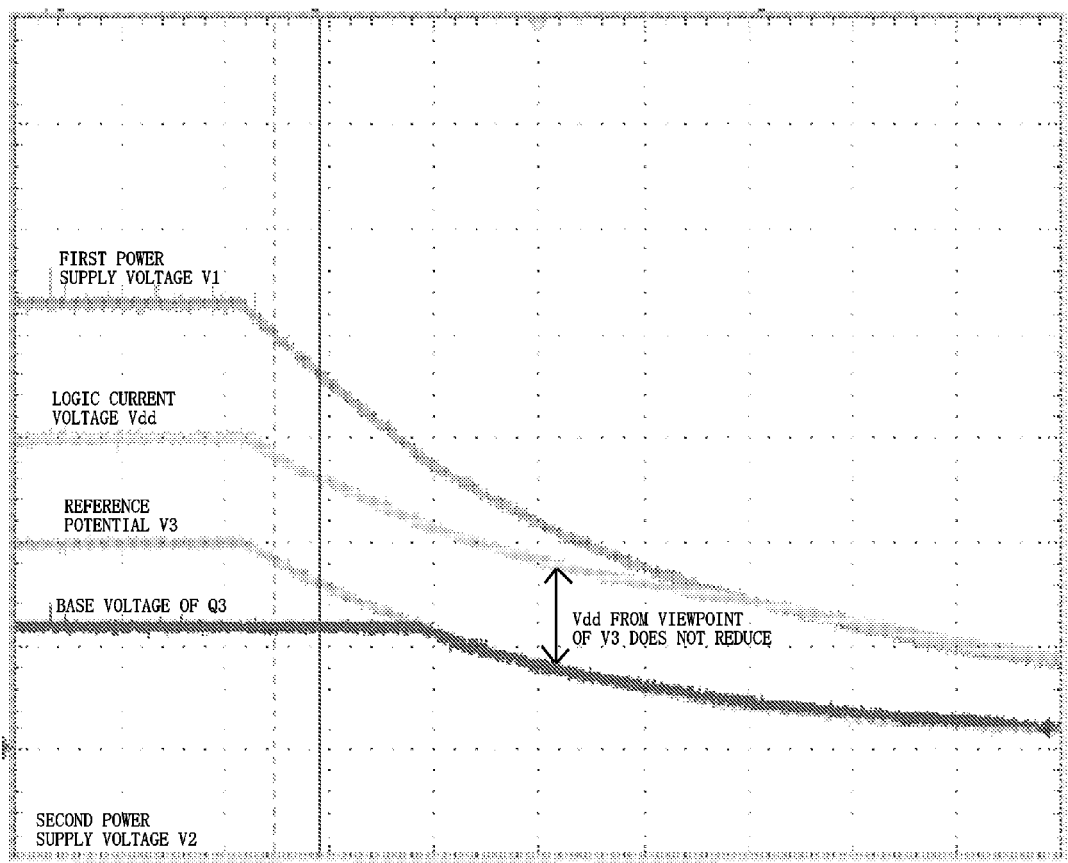
FIG. 4 is simulation results obtained by measuring respective voltages at the time when the switching amplifier 10 transitions into a power-off state.
Figure 5:
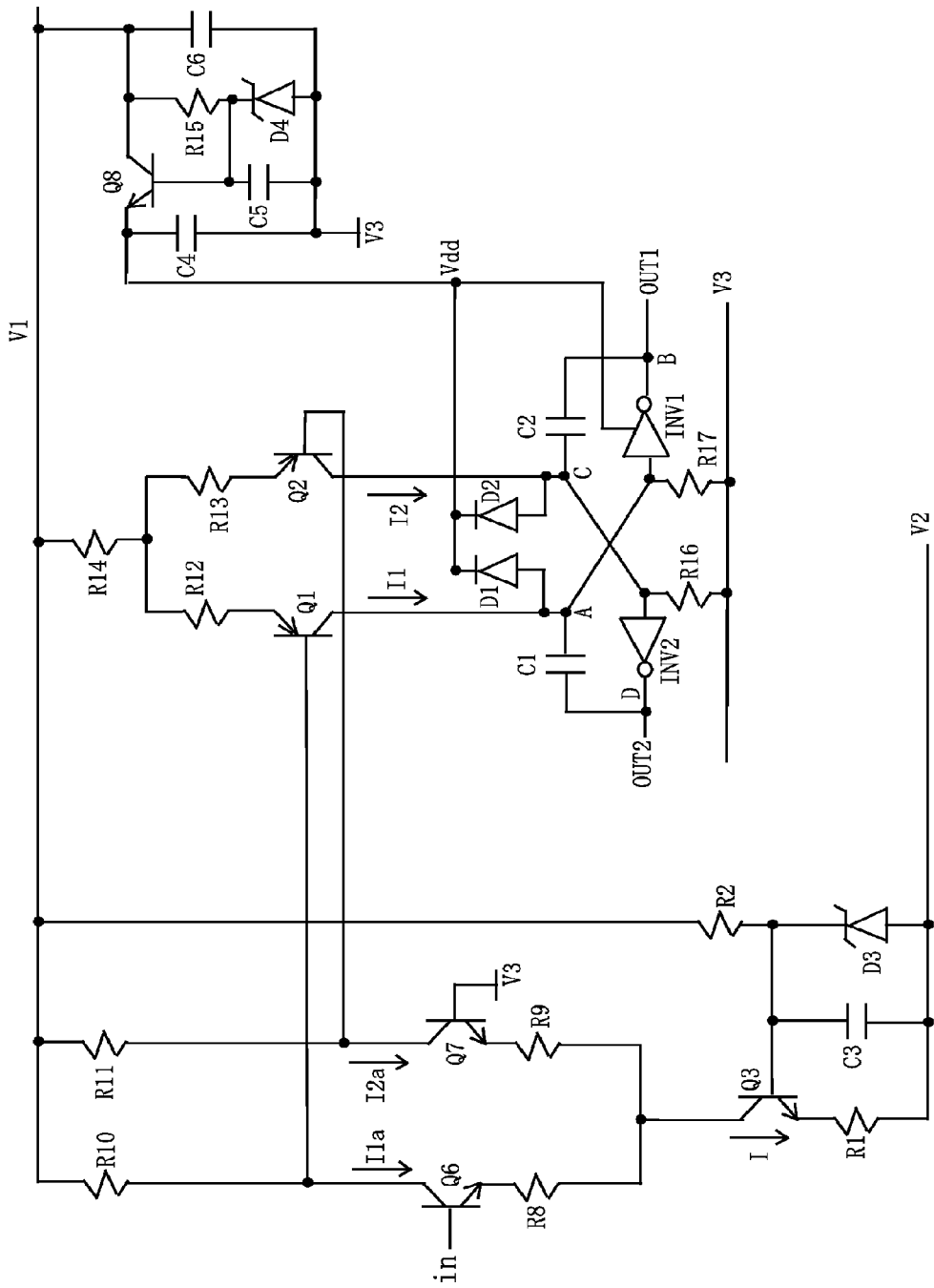
FIG. 5 is a circuit diagram illustrating the pulse-width modulating circuit described in the Description of the Related Art.

An operation for forcibly discharging the voltage of the capacitor C102 in the case where the switching amplifier 10 is made to transition into the power-off state is described below. FIG. 4 illustrates actual measurement values indicating changes in the first power supply voltage V1, the logic power supply voltage Vdd, the reference potential V3, the base voltage of the transistor Q3 and the second power supply voltage V2 in the case where the switching amplifier 10 is powered off. An abscissa in FIG. 4 represents time, and an ordinate represents a voltage value.

When the switching amplifier 10 is powered off, the switch unit SW is turned off in the power supply controller 16 of FIG. 1. Therefore, the cathode of the diode D101 becomes open to the first power supply voltage V1 line, and the voltage reduces to the second power supply voltage V2 via the resistor R104. Since an electric potential of the anode is higher than that of the cathode, the diode D101 is in the on state. In the transistor Q101, the electric current flows between the base and the emitter via the diode D101 and the resistor R104, the transistor Q101 is in the on state. As a result, an end of the capacitor C102 connected to the reference potential V3 is connected to the second power supply voltage V2 line via the resistor R105 and the emitter-to-collector of the transistor Q101. Therefore, the voltage of the capacitor C102 is forcibly discharged into the second power supply voltage V2 line. On the other hand, a forcible discharging route is not formed for the capacitor C101 even by the power supply controller 16, and thus the capacitor C101 is naturally discharged and reduces in a conventional manner. For this reason, the voltage of the capacitor C102 is discharged and reduced in advance of the voltage of the capacitor C101.

As shown in FIG. 4, when the voltage of the capacitor C102 is forcibly discharged and reduced, both the first power supply voltage V1 and the reference potential V3 reduce. This is because the first power supply voltage V1 corresponds to a sum of the voltage of the capacitor C101 and the voltage of the capacitor C102, and the reference potential V3 corresponds to the voltage of the capacitor C102.

As shown in FIG. 2, the constant current circuit 23 generates the constant current I based on the first power supply voltage V1 with respect to the second power supply voltage V2. That is to say, an anode of the zener diode D3 is connected to the second power supply voltage V2 line, and the cathode is connected to the first power supply voltage V1 line. However, the cathode of the zener diode D3 is connected also to the reference potential V3 via the base-to-collector of the transistor Q9. Therefore, when the reference potential V3 with respect to the second power supply voltage V2 reduces and the reference potential V3 reaches a voltage obtained by subtracting the base-to-collector potential of the transistor Q9 from the zener voltage of the zener diode D3, the voltage of the capacitor C3 is discharged into the reference potential V3 line via the base-to-collector of the transistor Q9. Similarly, the voltage of the capacitor C3 is discharged into the reference potential V3 line via the resistor R2, the transistors Q4 and Q5. As a result, the voltage supplied to the base of the transistor Q3 reduces according to the reduction in the reference potential V3, and the constant current I reduces.

On the other hand, the logic power supply circuit 12 generates the logic power supply voltage Vdd based on the first power supply voltage V1 with respect to the reference potential V3. As shown in FIG. 4, the logic power supply voltage Vdd becomes a voltage obtained by adding the zener voltage of the zener diode D4 to the reference potential V3 and subtracting the voltage of the transistor Q8 therefrom (the logic power supply voltage Vdd is such that (the voltage of the capacitor C4− the voltage between base and emitter of the transistor Q8)=((V3+5)−0.6) V). That is to say, since even when the voltage of the capacitor C102 is forcibly discharged, the voltage of the capacitor C101 is not forcibly discharged, (as long as a cathode voltage of the zener diode D4 does not become less than the zener voltage), the logic power supply voltage Vdd from the viewpoint of the reference potential V3 is fixed and does not reduce. The inverters INV1 and INV2 are operated by the logic power supply voltage Vdd and the reference potential V3, and the threshold voltage Vth is ½ of the logic power supply voltage Vdd with respect to the reference potential V3. Therefore, also the threshold voltages Vth of the inverters INV1 and INV2 do not reduce. For example, since the logic power supply voltage Vdd from the viewpoint of the reference potential V3 is fixed to 5 V, the threshold voltages Vth are maintained at 2.5 V.

Therefore, the capacitor C102 is forcibly discharged and the capacitor C101 is not forcibly discharged, so that the electric currents I1 and I2 flowing into the capacitors C1 and C2 can be reduced without reducing the threshold voltages Vth of the inverters INV1 and INV2 to values less than the voltages between both ends of the diodes D1 and D2. As a result, before the logic power supply voltage Vdd from the viewpoint of the reference potential V3 reduces (namely, before the threshold voltages Vth of the inverters INV1 and INV2 become less than the lowest voltages at the time of the discharging of the capacitors C1 and C2 (the voltages between both the ends of the diodes D1 and D2), the first electric current I1 and the second electric current I2 are reduced, so that the operation of the pulse generating unit 21 can be ended in the normal state. That is to say, both the inputs of the inverters INV1 and INV2 are prevented from being at the high level, thereby preventing the pulse-width modulating circuit from being inoperable.

The preferred embodiment of the present invention is described above, but the present invention is not limited to the above embodiment. For example, the first and second output elements may be switching elements such as transistors or MOSFET. Further, the present invention is applied also to a constitution such that oscillation stops when both the inputs of the first output element and the second output element are at the low level. That is to say, the present invention can be applied also to a case where the high level and the low level in this embodiment are switched.

What is claimed is:

1. A switching amplifier operated by a first power supply voltage, a second power supply voltage, and a reference potential as an electric potential between the first power supply voltage and the second power supply voltage, the switching amplifier comprising:
    a pulse-width modulating circuit for outputting a pulse width modulation signal according to an input signal;
    a logic power supply circuit for generating a logic power supply voltage with respect to the reference potential based on the first power supply voltage with respect to the reference potential, and supplying the generated logic power supply voltage to the pulse-width modulating circuit; and
    a switching output circuit that is operated on/off according to the pulse width modulation signal, wherein
    the pulse-width modulating circuit includes;
        a pulse generating unit being operated by the reference potential and the logic power supply voltage, the pulse generating unit having a first accumulating unit, a second accumulating unit, a first output element and a second output element, the pulse generating unit outputting the pulse width modulation signal from at least one of the first output element and the second output element by charging the first accumulating unit with a first electric current and charging the second accumulating unit with a second electric current,
        a constant current circuit for generating a constant current, and when the switching amplifier transitions into an off state, reducing the constant current according to a reduction in the reference potential with respect to the second power supply voltage,
        a current distribution unit for controlling a distribution ratio between the first electric current and the second electric current based on the input signal and the constant current, and controlling a time required for charging the first accumulating unit with the first electric current and a time required for charging the second accumulating unit with the second electric current so as to control a pulse width of the pulse width modulation signal, the switching amplifier further comprising:
    a power supply controller for, when the switching amplifier transitions into a power-off state, forcibly reducing the reference potential with respect to the second power supply voltage.

2. The switching amplifier according to claim 1, further comprising:
    a first capacitor for determining the first power supply voltage with respect to the reference potential; and
    a second capacitor for determining the reference potential with respect to the second power supply voltage,
    wherein when the switching amplifier transitions into the power-off state, the power supply controller forcibly discharges a charging voltage of the second capacitor.

3. The switching amplifier according to claim 2, wherein the power supply controller includes a first transistor connected between an end connected to the reference potential of the second capacitor and a line of the second power supply voltage, and when the switching amplifier transitions into the power-off state, the first transistor is turned on so that the end connected to the reference potential of the second capacitor is connected to the line of the second power supply voltage via the first transistor.

4. The switching amplifier according to claim 1, wherein
    the constant current circuit includes a second transistor, a third capacitor and a zener diode,
    a first terminal of the second transistor is connected to the line of the second power supply voltage, a second terminal of the second transistor is connected to the current distribution unit, a control terminal of the second transistor is connected to the line of the second power supply voltage via the third capacitor and connected to a cathode of the zener diode and the reference potential, and an anode of the zener diode is connected to the line of the second power supply voltage,
    an electric current flowing in the second terminal of the second transistor is the constant current and when the reference potential is less than a predetermined voltage determined by the zener voltage of the zener diode, a voltage of the control terminal of the second transistor reduces according to a reduction in the reference potential with respect to the second power supply voltage, and the constant current is reduced.

5. The switching amplifier according to claim 1, wherein
    the first accumulating unit and the second accumulating unit are capacitors, the first output element and the second output element are inverters, one end of the first accumulating unit is connected to an input of the first output element, an output of the first output element is connected to one end of the second accumulating unit, the other end of the second accumulating unit is connected to an input of the second output element, and an output of the second output element is connected to the other end of the first accumulating unit,
    when the reference potential with respect to the second power supply voltage is forcibly reduced in the case where the switching amplifier transitions into the power-off state, before the logic power supply voltage reduces and the threshold voltages of the first output element and the second output element are less than lowest voltages at the time of discharging the first accumulating unit and the second accumulating unit, the constant current circuit reduces the constant current.

\* \* \* \* \*